(12) United States Patent
Zhang

(10) Patent No.: US 10,305,486 B2
(45) Date of Patent: *May 28, 2019

(54) CONFIGURABLE COMPUTING ARRAY PACKAGE BASED ON PRINTED MEMORY

(71) Applicant: Guobiao Zhang, Corvallis, OR (US)

(72) Inventor: Guobiao Zhang, Corvallis, OR (US)

(73) Assignees: HangZhou HaiCun Information Technology Co., Ltd., HangZhou, ZheJiang (CN); Guobiao Zhang, Corvallis, OR (US)

( * ) Notice: Subject to any disclaimer, the term of this patent is extended or adjusted under 35 U.S.C. 154(b) by 20 days.

This patent is subject to a terminal disclaimer.

(21) Appl. No.: 15/917,530

(22) Filed: Mar. 9, 2018

(65) Prior Publication Data

US 2018/0198449 A1    Jul. 12, 2018

Related U.S. Application Data

(63) Continuation-in-part of application No. 15/450,017, filed on Mar. 5, 2017, now Pat. No. 9,948,306.

(30) Foreign Application Priority Data

Mar. 5, 2016   (CN) .......................... 2016 1 0125731
Mar. 7, 2018   (CN) .......................... 2018 1 0187776

(51) Int. Cl.
*H03K 19/177*   (2006.01)
*G11C 17/10*    (2006.01)
*G11C 5/02*     (2006.01)

(52) U.S. Cl.
CPC .......... *H03K 19/1776* (2013.01); *G11C 5/02* (2013.01); *G11C 17/10* (2013.01); *H03K 19/17728* (2013.01)

(58) Field of Classification Search
None
See application file for complete search history.

(56) References Cited

U.S. PATENT DOCUMENTS

| 4,870,302 A | 9/1989 | Freeman |
| 5,046,038 A | 9/1991 | Briggs et al. |
| 5,821,773 A * | 10/1998 | Norman ............. H03K 19/1737 326/39 |
| 5,835,396 A | 11/1998 | Zhang |

(Continued)

OTHER PUBLICATIONS

Paul et al., "Reconfigurable Computing Using Content Addressable Memory for Improved Performance and Resource Usage", Design Automation Conference (DAC), pp. 786-791, 2008.

(Continued)

*Primary Examiner* — Crystal L Hammond

(57) ABSTRACT

The present invention discloses a new type of configurable gate array—a configurable computing array package. It comprises at least a configurable computing die and a configurable logic die. The configurable computing die comprises at least one configurable computing element. The configurable computing element can selectively realize a basic function from a math library. It comprises a plurality of printed arrays for storing the look-up tables (LUT) for different basic functions. The configurable computing die and the configurable logic die are located in a same package.

20 Claims, 8 Drawing Sheets

(56) References Cited

U.S. PATENT DOCUMENTS

| | | | | |
|---|---|---|---|---|
| 5,926,036 | A * | 7/1999 | Cliff | G11C 8/12 326/39 |
| 5,954,787 | A | 9/1999 | Eun | |
| 6,181,159 | B1 * | 1/2001 | Rangasayee | H03K 19/17728 326/39 |
| 6,184,707 | B1 * | 2/2001 | Norman | H03K 19/17728 326/38 |
| 6,321,366 | B1 * | 11/2001 | Tseng | G06F 17/5022 326/94 |
| 6,810,513 | B1 * | 10/2004 | Vest | G06F 15/7867 326/37 |
| 7,212,448 | B1 * | 5/2007 | Trimberger | G06F 11/187 326/39 |
| 7,295,035 | B1 * | 11/2007 | Agrawal | H03K 19/17728 326/38 |
| 7,472,149 | B2 | 12/2008 | Endo | |
| 7,512,647 | B2 | 3/2009 | Wilson et al. | |
| 7,705,628 | B1 * | 4/2010 | Hutton | H03K 19/1736 326/37 |
| 7,746,102 | B1 * | 6/2010 | Young | G06F 9/3869 326/38 |
| 7,746,106 | B1 * | 6/2010 | Gaide | H03K 19/1736 326/38 |
| 7,746,112 | B1 * | 6/2010 | Gaide | H03K 19/17736 326/38 |
| 7,812,633 | B1 * | 10/2010 | Lee | H03K 19/17728 326/37 |
| 8,026,739 | B2 * | 9/2011 | Sullam | H03K 19/177 326/39 |
| 8,539,011 | B1 * | 9/2013 | Taylor | H03K 19/17728 708/232 |
| 8,564,070 | B2 | 10/2013 | Zhang | |
| 9,207,910 | B2 | 12/2015 | Azadet et al. | |
| 9,225,501 | B2 | 12/2015 | Azadet | |
| 2003/0001615 | A1 * | 1/2003 | Sueyoshi | H03K 19/17728 326/41 |
| 2004/0145942 | A1 * | 7/2004 | Leijten-Nowak | H03K 19/1737 365/154 |
| 2006/0028241 | A1 * | 2/2006 | Apostol | G01R 31/3172 326/41 |
| 2009/0070728 | A1 * | 3/2009 | Solomon | G06F 17/5045 716/128 |
| 2012/0012895 | A1 * | 1/2012 | Or-Bach | G03F 9/7076 257/204 |
| 2017/0115717 | A1 * | 4/2017 | Shankar | G05F 1/66 |

OTHER PUBLICATIONS

Karam et al, "Emerging Trends in Design and Applications of Memory-Based Computing and Content-Addressable Memories", Proceedings of the IEEE, vol. 103, issue 8, pp. 1311-1330, 2015.

"7 Series FPGAs Configurable Logic Block User Guide", Xilinx, Sep. 27, 2016, p. 21 https://www.xilinx.com/support/documentation/user_guides/ug474_7Series_CLB.pdf.

Harrison, et al. "The Computation of Transcendental Functions on the IA-64 Architecture", Intel Technology Journal, Q4, 1999, p. 6 https://www.intel.com/content/dam/www/public/us/en/documents/research/1999-vol03-iss-4-intel-technology-journal.pdf.

* cited by examiner

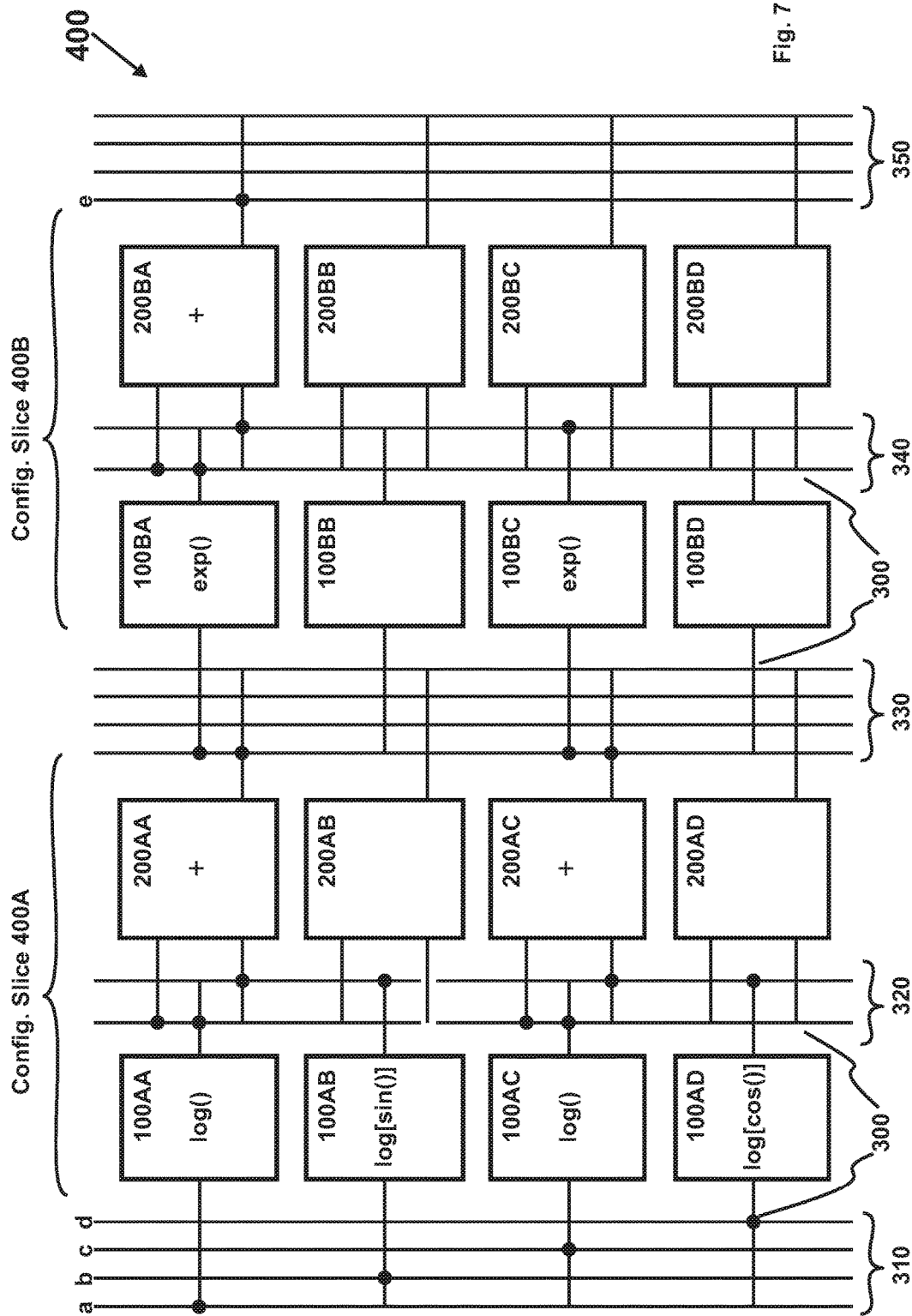

US 10,305,486 B2

CONFIGURABLE COMPUTING ARRAY PACKAGE BASED ON PRINTED MEMORY

CROSS-REFERENCE TO RELATED APPLICATIONS

This application is a continuation-in-part of "Configurable Gate Array Based on Three-Dimensional Printed Memory", application Ser. No. 15/450,017, filed Mar. 5, 2017, which claims priority from Chinese Patent Application 201610125731.8, filed on Mar. 5, 2016, in the State Intellectual Property Office of the People's Republic of China (CN), the disclosure of which is incorporated herein by reference in its entirety.

This application also claims priority from Chinese Patent Application 201810187776.7, filed on Mar. 7, 2018, in the State Intellectual Property Office of the People's Republic of China (CN), the disclosure of which is incorporated herein by reference in its entirety.

BACKGROUND

1. Technical Field of the Invention

The present invention relates to the field of integrated circuit, and more particularly to configurable gate array.

2. Prior Art

A configurable gate array is a semi-custom integrated circuit designed to be configured by a customer after manufacturing. It includes field programmable gate array (FPGA) and mask-programmed gate array (MPGA). U.S. Pat. No. 4,870,302 issued to Freeman on Sep. 26, 1989 (hereinafter referred to as Freeman) discloses a configurable gate array—FPGA. It contains an array of configurable logic elements (also known as configurable logic blocks) and a hierarchy of configurable interconnects (also known as programmable interconnects) that allow the configurable logic elements to be wired together. Each configurable logic element in the array is in itself capable of realizing any one of a plurality of logic functions (e.g. shift, logic NOT, logic AND, logic OR, logic NOR, logic NAND, logic XOR, arithmetic addition "+", arithmetic subtraction "−", etc.) depending upon a first configuration signal. Each configurable interconnect can selectively couple or de-couple interconnect lines depending upon a second configuration signal.

Math functions are widely used in various applications. To meet the speed requirements, many high-performance applications require that these math functions be implemented in hardware. In conventional configurable gate arrays, math functions are implemented in fixed computing elements, which are part of hard blocks and not configurable, i.e. the circuits implementing these math functions are fixedly connected and are not subject to change by programming. Apparently, fixed computing elements would limit further applications of the configurable gate array. To overcome this difficulty, the present invention expands the original concept of the configurable gate array by making the fixed computing elements configurable. In other words, besides configurable logic elements, the configurable gate array comprises configurable computing elements, which can realize any one of a plurality of math functions.

OBJECTS AND ADVANTAGES

It is a principle object of the present invention to extend the applications of a configurable gate array to the field of math computation.

It is a further object of the present invention to provide a configurable gate array where not only logic functions can be customized, but also math functions.

It is a further object of the present invention to provide a configurable gate array with more computing power.

In accordance with these and other objects of the present invention, the present invention discloses a new type of configurable gate array—a configurable computing array package.

SUMMARY OF THE INVENTION

The present invention discloses a new type of configurable gate array—a configurable computing array package. It is comprises at least a configurable computing die and a configurable logic die. The configurable computing die comprises an array of configurable logic elements. Each configurable computing element can selectively realize a math function from a math library. The math functions in the math library are generally referred to as basic functions and include functions such as exp, log, sin, cos, tan, a tan, sqrt, cbrt. Each configurable computing element comprises a plurality of printed arrays storing the look-up tables (LUT) for the basic functions. It further comprises at least an internal configurable interconnect to select the LUT of the desired basic function. In the present invention, the configurable computing die and the configurable logic die are formed in a same package and are preferably vertically stacked. They are electrically coupled through a plurality of inter-die connections.

The preferred configurable computing array package can be used to realize a complex math function. A complex math function is defined as a combination of basic functions. During computation, the complex math function is first decomposed into a number of basic functions. Each basic function is then realized by an associated configurable computing element. Finally, the complex math function is realized by programming the corresponding configurable logic elements and configurable interconnects.

Accordingly, the present invention discloses a configurable computing array, comprising: a configurable computing die comprising at least a configurable computing element, said configurable computing element comprising: a first printed array for storing a first look-up table (LUT) of a first basic function; a second printed array for storing a second LUT of a second basic function; a plurality of internal configurable interconnects coupling said first and second printed arrays; wherein said configurable computing element selectively realizes said first or second basic function by programming said internal configurable interconnects; a configurable logic die comprising a configurable logic element, wherein said configurable logic element selectively realizes a logic function from a logic library; a plurality of inter-die connections for coupling said configurable computing die and said configurable logic die; wherein said configurable computing array package realizes a complex math function by programming said configurable computing element and said configurable logic element.

The present invention further discloses a configurable computing array, comprising: a configurable computing die comprising at least a configurable computing element, said configurable computing element comprising: a first printed array for storing a first look-up table (LUT) of a first basic function; a second printed array for storing a second LUT of a second basic function; a plurality of internal configurable interconnects coupling said first and second printed arrays; wherein said configurable computing element selectively realizes said first or second basic function by programming said internal configurable interconnects; a configurable logic die comprising a configurable logic element, wherein said configurable logic element selectively realizes a logic function from a logic library; a plurality of inter-die connections for coupling said configurable computing die and said configurable logic die; at least a configurable interconnect for selectively realizing an interconnect from an interconnect library; wherein said configurable computing array realizes a complex math function by programming said configurable computing element, said configurable logic element and said configurable interconnect.

BRIEF DESCRIPTION OF THE DRAWINGS

FIG. 4A is its cross-sectional view; FIG. 4B is its substrate layout view;

FIG. 7 shows an implementation of the preferred configurable computing array package;

Figure 1:
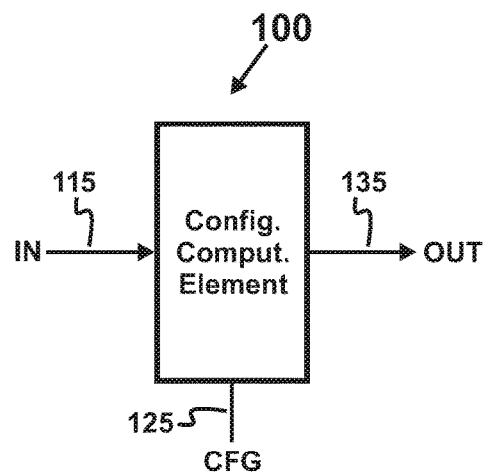
FIG. 1 discloses a symbol for a preferred configurable computing element.

It should be noted that all the drawings are schematic and not drawn to scale. Relative dimensions and proportions of parts of the device structures in the figures have been shown exaggerated or reduced in size for the sake of clarity and convenience in the drawings. The same reference symbols are generally used to refer to corresponding or similar features in the different embodiments.

DETAILED DESCRIPTION OF THE PREFERRED EMBODIMENTS

Those of ordinary skills in the art will realize that the following description of the present invention is illustrative only and is not intended to be in any way limiting. Other embodiments of the invention will readily suggest themselves to such skilled persons from an examination of the within disclosure.

FIG. 1 discloses a symbol for a preferred configurable computing element 100. The input port IN includes input data 115, the output port OUT includes output data 135, and the configuration port CFG includes at least a configuration signal 125. The configurable computing element 100 can selectively realize a math function from a math library depending on the configuration signal 125. In the present invention, the math functions in the math library are generally referred to as basic functions and include functions such as exp, log, sin, cos, tan, a tan, sqrt, cbrt.

Figure 2:
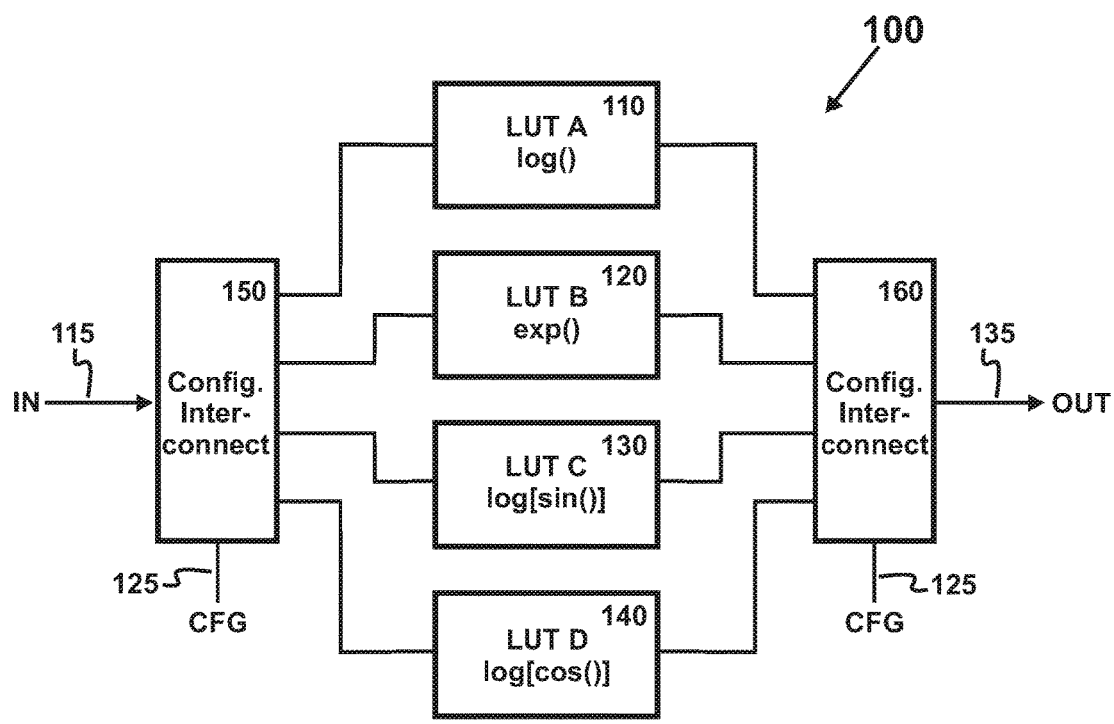
FIG. 2 is a circuit block diagram of a preferred configurable computing element. It also discloses a math library supported by the preferred configurable computing element.

FIG. 2 is a circuit block diagram of a preferred configurable computing element 100. It also discloses a math library supported thereby. The preferred configurable computing element 100 is based on a printed memory. It comprises a plurality of printed arrays 110-140 for storing the LUTs A-D of the math library. The math library supports four basic functions, including log( ) exp( ) log [sin( )], log [cos( )]. The printed array 110 stores the LUT A of log( ) the printed array 120 stores the LUT B 120 of exp( ) the printed array 130 stores the LUT C 130 of log [sin( )]; and the printed array 140 stores the LUT D of log [cos( )]. The preferred computing element 100 further comprises first and second internal configurable interconnects 150, 160. In this preferred embodiment, the first internal configurable interconnect 150 is a 1-to-4 demultiplexer, the second internal configurable interconnect 160 is a 4-to-1 multiplexer. To realize, for instance, a basic function exp( ) from the math library, the first internal configurable interconnect 150 is configured in such a way that the input data 115 is sent to the printed array 120, which is used as an address to read the value of exp( ) from the LUT B; and the second internal configurable interconnect 160 is configured in such a way that the read-out value from the LUT B is sent out as the output data 135. It should be apparent to those skilled in the art that the math library could have more math functions. For example, it could have eight math functions, including log( ) exp( ), sin( ), cos( ), sqrt( ), cbrt( ), tan( ), a tan( ). Other combinations are also possible.

For the printed memory, the data are recorded thereto using a printing method during manufacturing. For the printing method, the data are fixedly recorded and cannot be changed after manufacturing. The printing method includes photo-lithography, nano-imprint, e-beam lithography, DUV lithography, laser-programming, and others. As the data are recorded during manufacturing and cannot be changed, the printed memory does not need to support electrical programming. In contrast, a writable memory needs to support electrical programming. Because the read voltage/current of a writable cell has to smaller than its programming voltage/current, the read voltage/current of a writable cell is smaller than that of a printed cell and therefore, the read access of the writable memory is slower than the printed memory. Thus, the printed memory is better suited for high-performance computing.

One printed memory of particular importance is a three-dimensional printed memory (3D-P, referring to U.S. patent application Ser. No. 15/450,017). Using 3D-P for the preferred configurable computing element 100 offers many advantages. First of all, because it is faster than a three-dimensional writable memory (3D-W), 3D-P can be used to realize high-performance configurable computing elements. Secondly, the 3D-P arrays storing the LUTs for different basic math functions either have the same size, or differ by an integral multiple. The 3D-P arrays for different basic math functions can be arranged in different memory levels and vertically stacked within a same 3D-M block. This would save substantial die area. Thirdly, because the 3D-P array does not occupy any substrate area, the internal configurable interconnects 150, 160 can be formed underneath the 3D-P arrays. This would further save die area.

Figure 3:
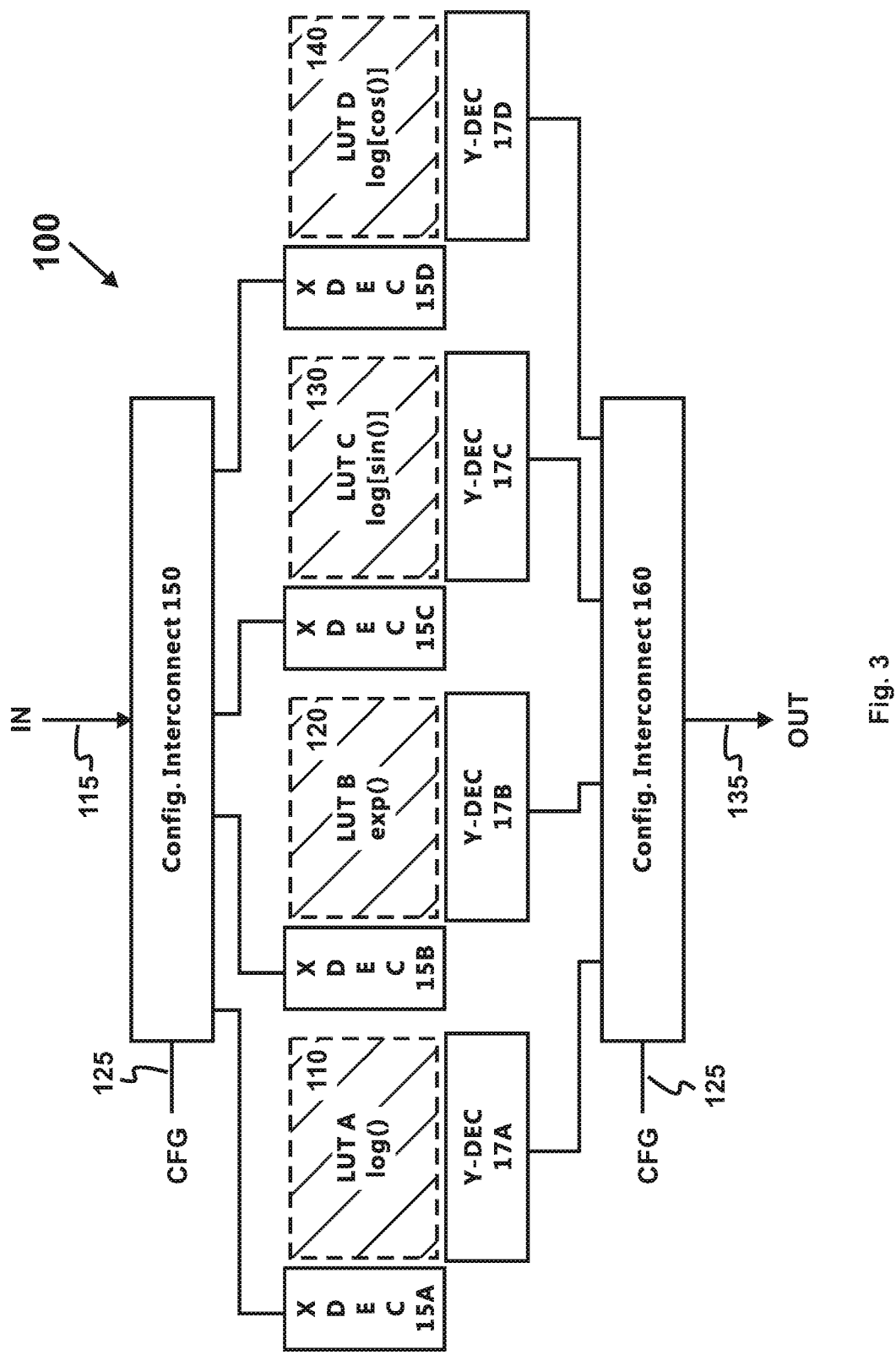
FIG. 3 is a layout view of a first implementation of the preferred configurable computing element. It also shows a math library supported by this preferred configurable computing element.

FIG. 3 discloses a first implementation of the preferred configurable computing element 100. In this preferred embodiment, each LUT is stored in a printed array: the LUT A is stored in the printed array 110, the LUT B is stored in the printed array 120, the LUT C is stored in the printed array 130, and the LUT D is stored in the printed array 140. These printed arrays 110-140 are placed side-by-side. The preferred configurable computing element 100 further includes the internal configurable interconnects 150, 160 and the decoders for the printed arrays 110-140. For example, the X decoder 15A and Y decoder (including read-out circuit) 17A for the printed array 110.

Figure 4A:
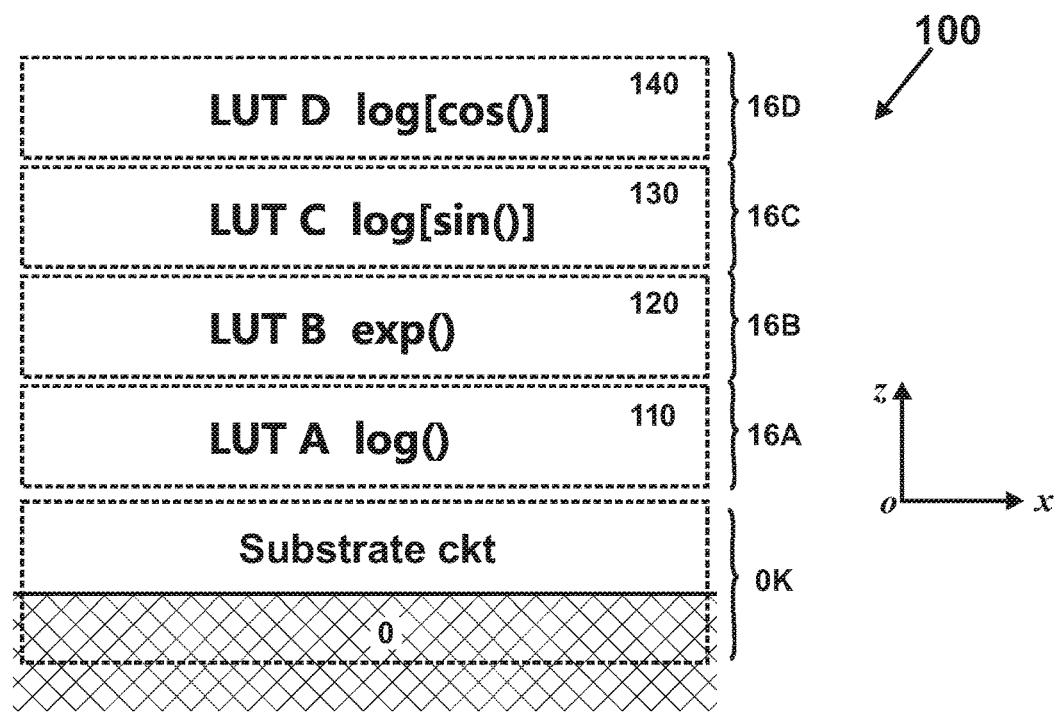
FIGS. 4A-4B disclose a second implementation of the preferred configurable computing element.
Figure 4B:
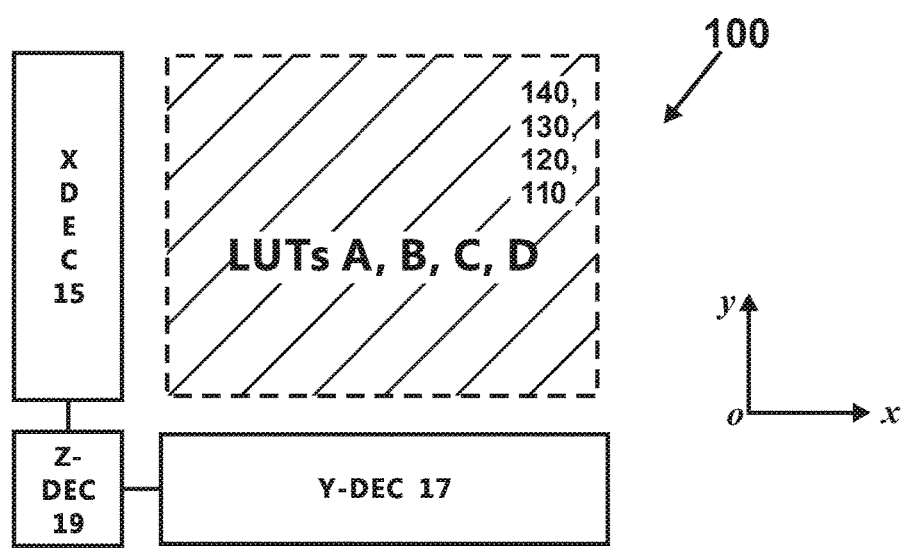

To minimize the substrate area occupied by the configurable computing element 100, the printed arrays storing the LUTs for different basic functions are vertically stacked. FIGS. 4A-4B discloses a second implementation of the preferred configurable computing element 100. In the cross-sectional view of the preferred embodiment (FIG. 4A), the printed array 110 (storing LUT A for the function log( ) is stacked above the substrate circuit OK (along the +Z direction), the printed array 120 (storing LUT B for the function exp( )) is stacked above the printed array 110 (along the +Z direction), the printed array 130 (storing LUT C for the function log [sin( )]) is stacked above the printed array 120 (along the +Z direction), and the printed array 140 (storing LUT D for the function log [cos( )]) is stacked above the printed array 130 (along the +Z direction). This arrangement becomes more apparent in the substrate layout view of FIG. 4B. The projections of the printed arrays 110-140 (storing the LUTs A-D) overlap each other on the substrate 0. The substrate area occupied by this preferred embodiment is only ~¼ of that of FIG. 3. Here, Z decoder 19 is, in fact, the internal configurable interconnects 150, 160. The printed arrays 110-140 in FIGS. 4A-4B form a 3D-P. More details on 3D-P are disclosed in U.S. patent application Ser. No. 15/390,498.

Figure 5:
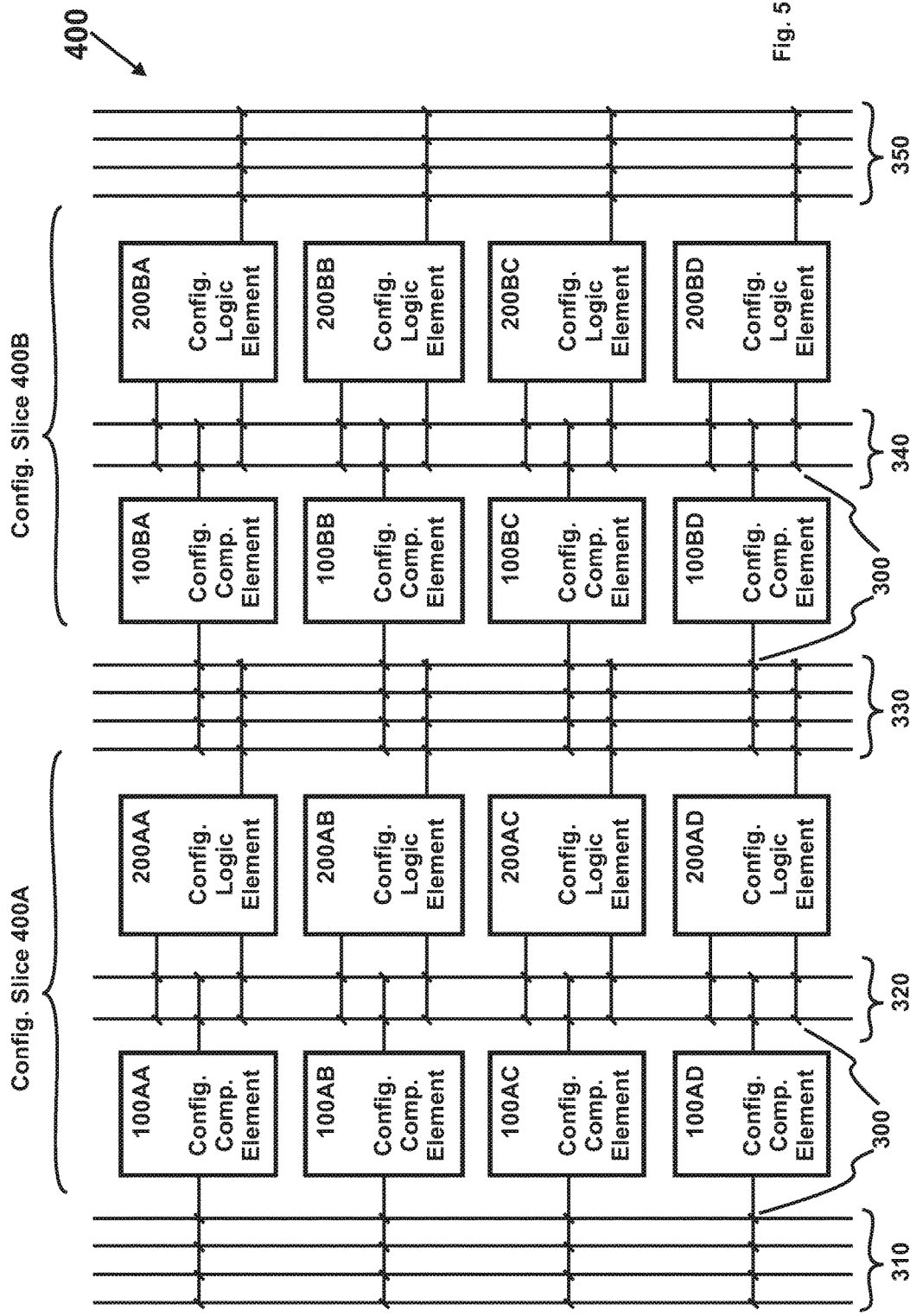
FIG. 5 is a circuit block diagram of a preferred configurable computing array package.

Referring now to FIG. 5, a preferred configurable computing array package 400 is disclosed. It comprises at least first and second configurable slices 400A, 400B. Each configurable slice (e.g. 400A) comprises a first array of configurable computing elements (e.g. 100AA-100AD) and a second array of configurable logic elements (e.g. 200AA-200AD). A configurable channel 320 is placed between the first array of configurable computing elements (e.g. 100AA-100AD) and the second array of configurable logic elements (e.g. 200AA-200AD). The configurable channels 310, 330, 350 are also placed between different configurable slices 300A, 300B. The configurable channels 310-350 comprise a plurality of configurable interconnects 300. For those skilled in the art, besides configurable channels, sea-of-gates may also be used. In some embodiments, the preferred configurable computing array 400 further comprises at least a multiplier, which is coupled with selected configurable computing elements and/or selected configurable logic elements through a set of configurable interconnects. This multiplier performs multiplication between two variables.

Figure 6A:
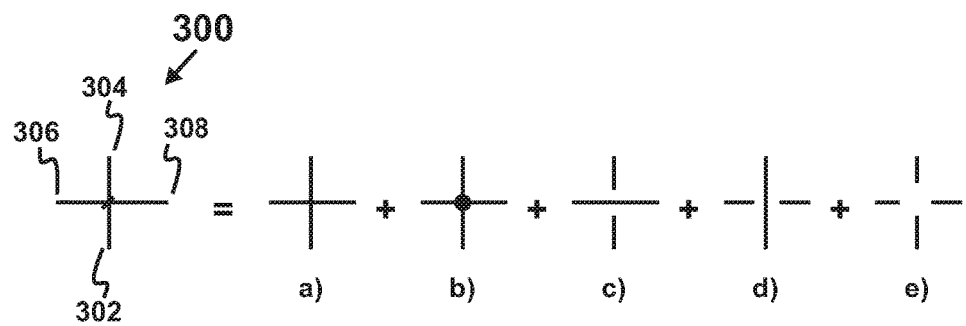
FIG. 6A shows an interconnect library supported by a preferred configurable interconnect.

FIG. 6A shows an interconnect library supported by a preferred configurable interconnect 300. An interconnect library is a collection of all interconnects supported by a configurable interconnect. This interconnect library includes the followings: a) the interconnects 302/304 are coupled, the interconnects 306/308 are coupled, but 302/304 are not connected with 306/308; b) the interconnects 302/304/306/308 are all coupled; c) the interconnects 306/308 are coupled, but the interconnects 302, 304 are not coupled, neither are 302, 304 connected with 306/308; d) the interconnects 302/304 are coupled, but the interconnects 306, 308 are not coupled, neither are 306, 308 connected with 302/304; e) interconnects 302, 304, 306, 308 are not coupled at all. As used herein, the symbol "/" between two interconnects means that these two interconnects are coupled, while the symbol "," between two interconnects means that these two interconnects are not coupled. More details on the configurable interconnects are disclosed in Freeman.

Figure 6B:
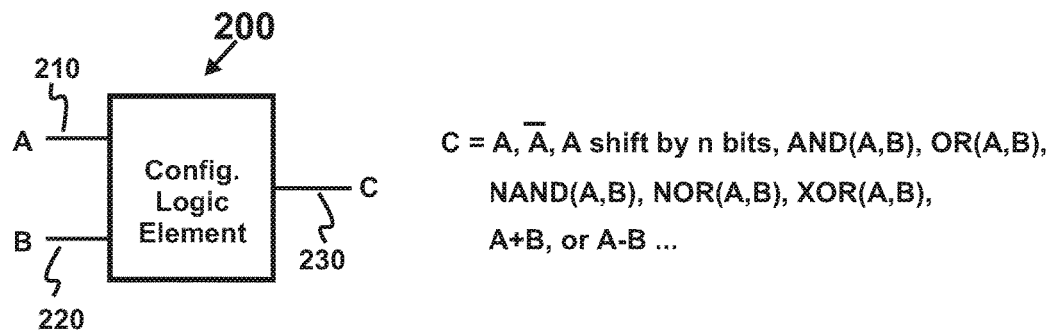
FIG. 6B shows a logic library supported by a preferred configurable logic element.

FIG. 6B shows a logic library supported by a preferred configurable logic element 200. A logic library is a collection of all logic functions supported by a configurable logic element. In this preferred embodiment, the inputs A and B are input data 210, 200, and the output C is the output data 230, the logic library includes the followings: C=A, NOT A, A shift by n bits, AND(A,B), OR(A,B), NAND(A,B), NOR (A,B), XOR(A,B), A+B, A−B. To facilitate pipelining, the configurable logic element 200 may comprise sequential logic such as flip-flops and registers. More details on the configurable logic elements are disclosed in Freeman.

Referring now to FIG. 7, a preferred configurable computing array package implementing a complex math function e=a·sin(b)+c·cos(d) is disclosed. The configurable interconnects 300 in the configurable channel 310-350 use the same convention as FIG. 6A: the interconnects with dots at the intersection mean that the interconnects are connected; the interconnects without dots at the intersection mean that the interconnects are not connected; a broken interconnect means that two broken sections are two un-coupled interconnect lines. In this preferred implementation, the configurable computing element 100AA is configured to realize the function log( ) whose result log(a) is sent to a first input of the configurable logic element 200A. The configurable computing element 100AB is configured to realize the function log [sin( )], whose result log [sin(b)] is sent to a second input of the configurable logic element 200A. The configurable logic element 200A is configured to realize arithmetic addition, whose result log(a)+log [sin(b)] is sent the configurable computing element 100BA. The configurable computing element 100BA is configured to realize the function exp( ), whose result exp{log(a)+log [sin(b)]}=a·sin(b) is sent to a first input of the configurable logic element 200BA. Similarly, through proper configuration, the results of the configurable computing elements 100AC, 100AD, the configurable logic elements 200AC, and the configurable computing element 100BC are sent to a second input of the configurable logic element 200BA. The configurable logic element 200BA is configured to realize arithmetic addition, whose result a·sin(b)+c·cos(d) is sent to the output e. Apparently, by changing its configuration, the configurable computing array 400 can realize other complex math functions.

Figure 8:
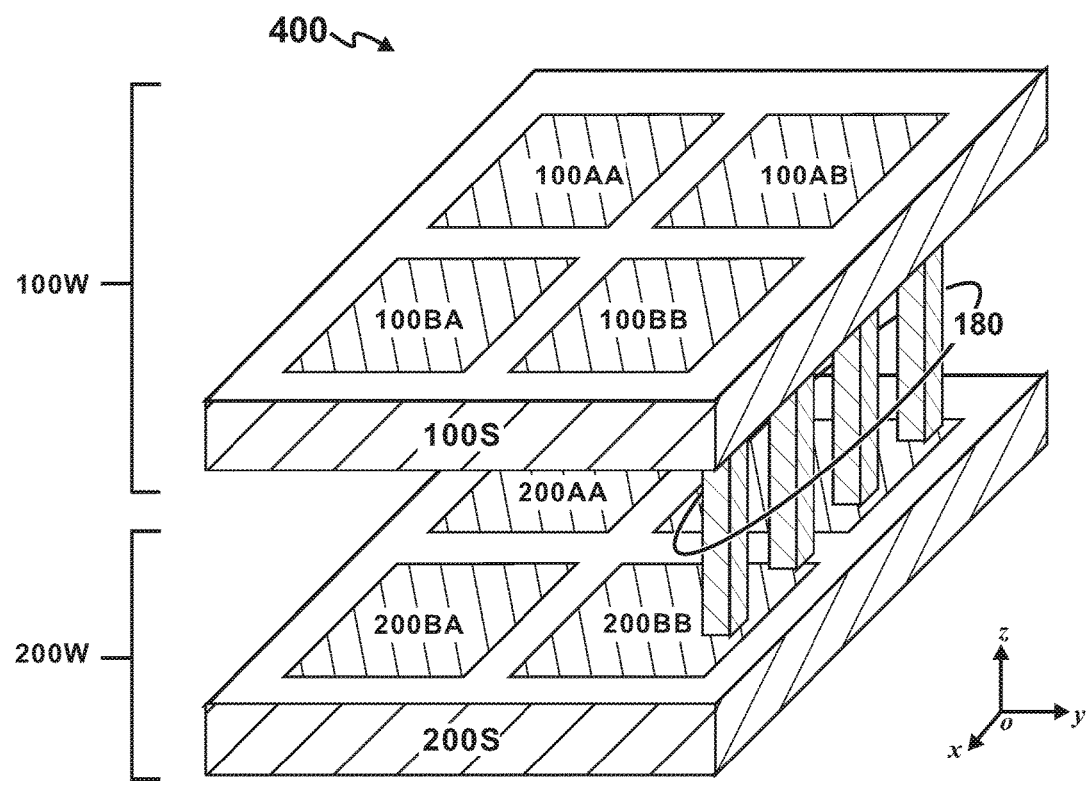
FIG. 8 is a perspective view of a preferred configurable computing array package.

Referring now to FIG. 8, a perspective view of a preferred configurable computing array package 400 is disclosed. The preferred configurable computing array package 400 comprises a configurable computing die 100W and a configurable logic die 200W. The configurable computing die 100W is formed on a first semiconductor substrate 1005 and comprises at least an array of configurable computing elements 100AA-100BB. Each configurable computing element 100 comprises a plurality of printed arrays for storing the LUTs for the basic functions in a math library. On the other hand, the configurable logic die 200W is formed on a second semiconductor substrate 200S and comprises at least an array of configurable logic elements 200AA-200BB. Each configurable logic element 200 selectively realizes a logic function from a logic library. The configurable computing die 100W and the configurable logic die 200W are located in a same package. In this preferred embodiment, the configurable computing die 100W is stacked on/above the configurable logic die 200W. As will be shown in FIGS. 9A-9C, other stacking configurations are possible. In addition, the configurable computing die 100W and the configurable logic die 200W are communicatively coupled by a plurality of inter-die connections 180. Exemplary inter-die connections include micro-bumps and through-silicon-vias (TSV). The preferred configurable computing array package 400 further comprises a plurality of configurable interconnects, each of which selectively realizes an interconnect from an interconnect library. The configurable interconnects could be located on the configurable computing die 100W and/or the configurable logic die 200W.

Figure 9A:
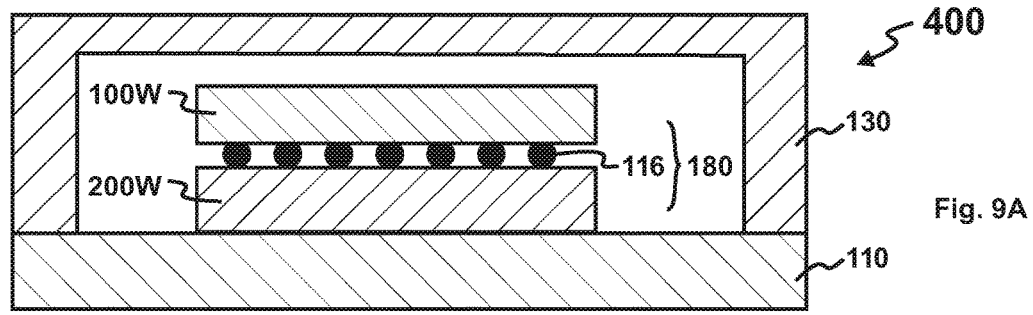
FIGS. 9A-9C are cross-sectional views of three preferred configurable computing array packages.
Figure 9B:
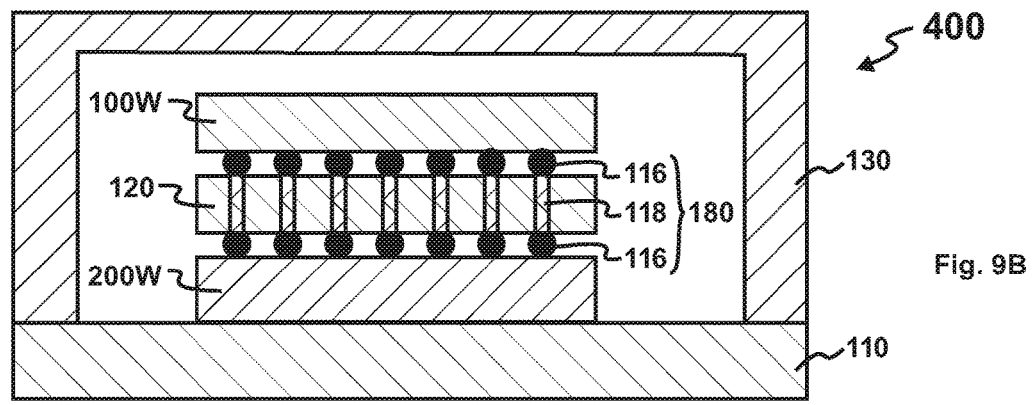
Figure 9C:
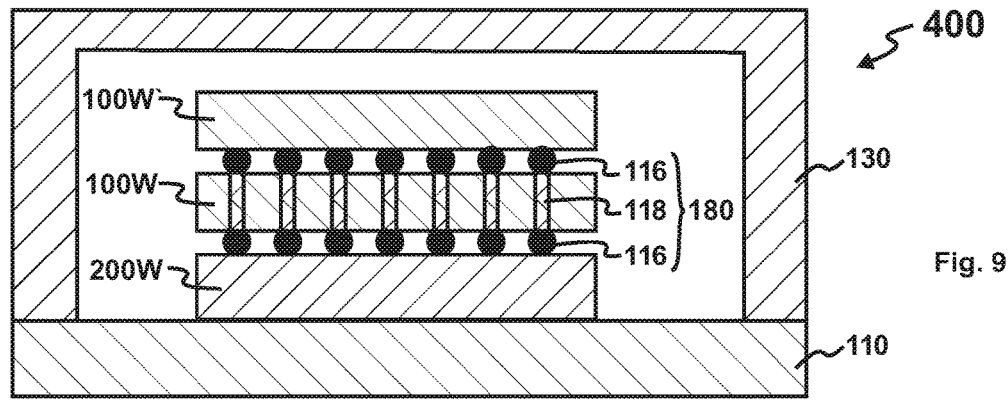

Referring now to FIGS. 9A-9C, the cross-sectional views of three preferred configurable computing array package 400 are shown. These preferred embodiments are located in multi-chip packages (MCP). Among them, the configurable computing array package 400 in FIG. 9A comprises two separate dice: a configurable computing die 100W and a configurable logic die 200W. The dice 100W, 200W are stacked on the package substrate 110 and located in a same package 130. Micro-bumps 116 act as the inter-die connections 180 and provide electrical coupling between the dice 100, 200. In this preferred embodiment, the configurable computing die 100W is stacked on the configurable logic die 200W; the configurable computing die 100W is flipped and then bonded face-to-face with the configurable logic die 200W. Alternatively, the configurable logic die 200W could be stacked on/above the configurable computing die 100W. Either die does not have to be flipped.

The configurable computing array package 400 in FIG. 9B comprises a configurable computing die 100W, an interposer 120 and a configurable logic die 200W. The interposer 120 comprise a plurality of through-silicon vias (TSV) 118. The TSVs 118 provide electrical couplings between the configurable computing die 100W and the configurable logic die 200W. They offer more freedom in design and facilitate heat dissipation. In this preferred embodiment, the TSVs 118 and the micro-bumps 116 collectively form the inter-die connections 180.

The configurable computing array package 400 in FIG. 9C comprises at least two configurable computing dice 100W, 100W' and a configurable logic die 200W. These dice 100W, 100W, 200W are separate dice and located in a same package 130. Among them, the configurable computing die 100W' is stacked on the configurable computing die 100W, while the configurable computing die 100W is stacked on the configurable logic die 200W. The dice 100W, 100W, 200W are electrically coupled through the TSVs 118 and the micro-bumps 116. Apparently, the LUT in FIG. 10C has a large capacity than that in FIG. 9A. Similarly, the TSVs 118 and the micro-bumps 116 collectively form the inter-die connections 180.

Because the configurable computing die 100W and the configurable logic die 200W are located in a same package, this type of integration is referred to as 2.5-D integration. The 2.5-D integration excels the conventional 2-D integration in many aspects. Firstly of all, the footprint of a conventional 2D-integrated configurable computing array is roughly equal to the sum of those of the configurable computing elements, the configurable logic elements and the configurable interconnects. On the other hand, because the 2.5-D integration moves the configurable computing elements from aside to above, the configurable computing array package 400 becomes smaller and computationally more powerful. Secondly, because they are physically close and coupled by a large number of inter-die connections 180, the configurable computing die 100W and the configurable logic die 200W have a larger communication bandwidth than the conventional 2D-integrated configurable computing array. Thirdly, the 2.5-D integration benefits manufacturing process. Because the configurable computing die 100W and the configurable logic die 200W are separate dice, the memory transistors in the configurable computing die 100W and the logic transistors in the configurable logic die 200W are formed on separate semiconductor substrates. Consequently, their manufacturing processes can be individually optimized.

The preferred embodiments disclosed in FIGS. 5 and 7 are field-programmable computing arrays (FPCA). In FPCA, the wafers are fully finished, i.e. all configurable computing elements, configurable logic elements and configurable interconnects are finished together. The functions of the FPCA are later defined in the field. The inventive concepts of the present invention can be easily extended to back-end programmable computing arrays. In the back-end programmable computing arrays, the wafers are half-finished, i.e. only the configurable computing elements and the configurable logic elements are finished, while the configurable interconnects are not. Once the chip functions are defined, the configurable channels 310-350 are customized by the back-end process.

While illustrative embodiments have been shown and described, it would be apparent to those skilled in the art that many more modifications than that have been mentioned above are possible without departing from the inventive concepts set forth therein. The invention, therefore, is not to be limited except in the spirit of the appended claims.

What is claimed is:

1. A configurable computing array package, comprising:
a configurable computing die comprising at least an array of configurable computing elements including a configurable computing element, said configurable computing element comprising:
  a first printed array for storing a first look-up table (LUT) of a first basic math function, wherein said first LUT includes numerical values related to said first basic math function;
  a second printed array for storing a second LUT of a second basic math function, wherein said second LUT includes numerical values related to said second basic math function;
  a plurality of internal configurable interconnects coupling said first and second printed arrays;
  wherein said configurable computing element selectively realizes said first or second basic math function by programming said internal configurable interconnects;
a configurable logic die comprising at least an array of configurable logic elements including a configurable logic element, wherein said configurable logic element selectively realizes a logic function from a logic library;
a plurality of inter-die connections for coupling said configurable computing die and said configurable logic die;
wherein said configurable computing array package realizes a complex math function by programming said array of configurable computing elements and said array of configurable logic elements.

2. The configurable computing array package according to claim 1, wherein said first and second printed arrays are placed side-by-side.

3. The configurable computing array package according to claim 1, wherein said second printed array is stacked above said first printed array.

4. The configurable computing array package according to claim 3, wherein said second printed array at least partially covers said first printed array.

5. The configurable computing array package according to claim 1, wherein said first and second LUTs are respectively recorded into said first and second printed arrays using a printing method during manufacturing.

6. The configurable computing array package according to claim 5, wherein said printing method is photo-lithography, nano-imprint, e-beam lithography, DUV lithography, or laser-programming.

7. The configurable computing array package according to claim 1, wherein said configurable computing die and said configurable logic die are vertically stacked.

8. The configurable computing array package according to claim 1, further comprising more than one configurable computing dice.

9. A configurable computing array package, comprising:
   a configurable computing die comprising at least an array of configurable computing elements including a configurable computing element, said configurable computing element comprising:
      a first printed array for storing a first look-up table (LUT) of a first basic math function, wherein said first LUT includes numerical values related to said first basic math function;
      a second printed array for storing a second LUT of a second basic math function, wherein said second LUT includes numerical values related to said second basic math function;
      a plurality of internal configurable interconnects coupling said first and second printed arrays;
      wherein said configurable computing element selectively realizes said first or second basic math function by programming said internal configurable interconnects;
   a configurable logic die comprising at least an array of configurable logic elements including a configurable logic element, wherein said configurable logic element selectively realizes a logic function from a logic library;
   a plurality of inter-die connections for coupling said configurable computing die and said configurable logic die;
   at least an array of configurable interconnects including a configurable interconnect for selectively realizing an interconnect from an interconnect library;
   wherein said configurable computing array realizes a complex math function by programming said array of configurable computing elements, said array of configurable logic elements and said array of configurable interconnects.

10. The configurable computing array package according to claim 9, wherein said first and second printed arrays are placed side-by-side.

11. The configurable computing array package according to claim 9, wherein said second printed array is stacked above said first printed array.

12. The configurable computing array package according to claim 11, wherein said second printed array at least partially covers said first printed array.

13. The configurable computing array package according to claim 9, wherein said first printed array is stacked above said internal configurable interconnects.

14. The configurable computing array package according to claim 9, wherein said second printed array is stacked above said internal configurable interconnects.

15. The configurable computing array package according to claim 9, wherein said configurable interconnect is formed on said configurable computing die.

16. The configurable computing array package according to claim 9, wherein said configurable interconnect is formed on said configurable logic die.

17. The configurable computing array package according to claim 9, wherein said first and second LUTs are respectively recorded into said first and second printed arrays using a printing method during manufacturing.

18. The configurable computing array package according to claim 17, wherein said printing method is photo-lithography, nano-imprint, e-beam lithography, DUV lithography, or laser-programming.

19. The configurable computing array package according to claim 9, wherein said configurable computing die and said configurable logic die are vertically stacked.

20. The configurable computing array package according to claim 9, further comprising more than one configurable computing dice.

* * * * *